United States Patent
Yui et al.

(10) Patent No.: US 8,283,240 B2
(45) Date of Patent: Oct. 9, 2012

(54) METHOD FOR FABRICATING SEMICONDUCTOR DEVICE

(75) Inventors: Keiichi Yui, Kanagawa (JP); Isao Makabe, Kanagawa (JP); Ken Nakata, Kanagawa (JP); Takamitsu Kitamura, Kanagawa (JP); Akira Furuya, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/171,642

(22) Filed: Jun. 29, 2011

(65) Prior Publication Data
US 2012/0003820 A1 Jan. 5, 2012

(30) Foreign Application Priority Data
Jun. 30, 2010 (JP) ................... 2010-150057

(51) Int. Cl.
*H01L 21/20* (2006.01)

(52) U.S. Cl. .............. 438/507; 438/763; 257/E21.398

(58) Field of Classification Search .................. 438/503, 438/776, 777; 257/E21.299, E21.398, E21.441, 257/E21.449
See application file for complete search history.

(56) References Cited

U.S. PATENT DOCUMENTS
2008/0210949 A1   9/2008   Makabe et al.

FOREIGN PATENT DOCUMENTS
JP   2008-166349 A   7/2008

*Primary Examiner* — Cheung Lee
(74) *Attorney, Agent, or Firm* — Westerman, Hattori, Daniels & Adrian, LLP

(57) ABSTRACT

A method for fabricating a semiconductor device includes forming an AlN layer on a substrate made of silicon by supplying an Al source without supplying a N source and then supplying both the Al source and the N source, and forming a GaN-based semiconductor layer on the AlN layer after the forming of the AlN layer. The forming of the AlN layer grows the AlN layer so as to satisfy the following:

$$76500/x^{0.81} < y < 53800/x^{0.83}$$

where x is a thickness of the AlN layer and y is an FWHM of a rocking curve of a (002) plane of the AlN layer.

6 Claims, 4 Drawing Sheets

1

METHOD FOR FABRICATING SEMICONDUCTOR DEVICE

CROSS-REFERENCE TO RELATED APPLICATION

This application is based upon and claims the benefit of priority of the prior Japanese Patent Application No. 2010-150057 filed on Jun. 30, 2010, the entire contents of which are incorporated herein by reference.

BACKGROUND (i) Technical Field

A certain aspect of the embodiments discussed herein is related to a method for fabricating a semiconductor device.

(ii) Related Art

Conventionally, there is known a semiconductor device formed by stacking, on a semi-insulation substrate, GaN-based semiconductor layers such as a buffer layer, a GaN layer and an AlGaN layer. As an exemplary GaN-based semiconductor device, there is known an electronic device having an FET (Field Effect Transistor) structure that utilizes carriers with very high concentration generated at an interface between GaN-based semiconductor layers.

A silicon carbide (SiC) may be used as a substrate for the electronic devices using group III nitride semiconductors as described above. However, SiC is expensive and has difficulties in realizing a large scale wafer and reducing defects such as micropipes. Therefore, it is required to use another substrate. The use of silicon for the substrate is considered. Silicon is less expensive and easily realizes a large-scale wafer and a few crystal defects. It is to be noted that Si of the substrate reacts with Ga. This reaction may make it difficult to grow the GaN-based semiconductor layer having a desired crystal structure. Thus, a buffer layer may be interposed between the Si substrate and the GaN-based semiconductor layer. The buffer layer may be an AlN layer, for example. The buffer layer prevents impurities such as Ga from diffusing into the Si substrate. Japanese Patent Application Publication No. 2008-166349 describes a process of growing a GaN-based semiconductor layer on the substrate and adjusting the Al composition ratio of the AlGaN layer.

However, the crystal quality of the AlN layer may affect the semiconductor device.

SUMMARY

According to an aspect of the present invention, there is provided a method for fabricating a semiconductor device including: forming an AlN layer on a substrate made of silicon by supplying an Al source without supplying a N source and then supplying both the Al source and the N source; and forming a GaN-based semiconductor layer on the AlN layer after the forming of the AlN layer, the forming of the AlN layer growing the AlN layer so as to satisfy the following:

$$76500/x^{80.1} < y < 53800/x^{0.83}$$

where x is a thickness of the AlN layer and y is an FWHM of a rocking curve of a (002) plane of the AlN layer.

DETAILED DESCRIPTION

Embodiments of the present invention are described below.
(First Embodiment)

Figure 1:
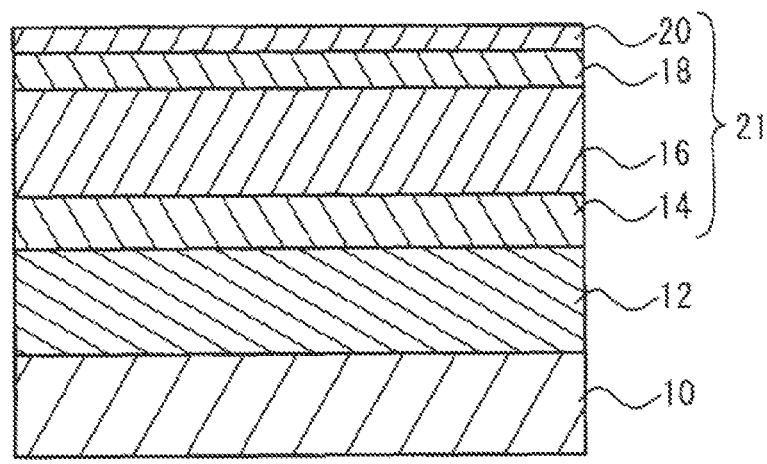
FIG. 1 is a cross-sectional view of an exemplary semiconductor device.

Now, a description is given of a structure of a semiconductor device. FIG. 1 is a cross-sectional view of a semiconductor device.

Referring to FIG. 1, an AlN layer 12 is formed directly on a Si substrate 10. The AlN layer 12 functions as a buffer layer. A GaN-based semiconductor layer 21 is formed on the AlN layer 12. The GaN-based semiconductor layer 21 includes an AlGaN layer 14, an undoped GaN layer 16, an n-type AlGaN layer 18, and an n-type GaN layer 20. More particularly, the AlGaN layer 14 is provided so as to contact the top of the AlN layer 12. The undoped GaN layer 16 made of undoped GaN is formed on the AlGaN layer 14. The n-type AlGaN layer 18, which is an exemplary n-type semiconductor layer, is formed on the undoped GaN layer 16. The n-type GaN layer 20, which is an exemplary n-type semiconductor layer, is formed on the n-type AlGaN layer 18. Due to the presence of the AlN layer 12, the Si substrate 10 and the GaN-based semiconductor layer 21 do not contact each other.

The AlN layer 12 may be 300 nm thick. The AlGaN layer 14 may be 100 nm thick and may have an Al composition ratio of 0.5. The undoped GaN layer 16 may be 1000 nm thick. The n-type AlGaN layer 18 may be 20 nm thick, and may have an Al composition ratio of 0.2. The n-type GaN layer 20 may be 2 nm thick.

Figure 2:
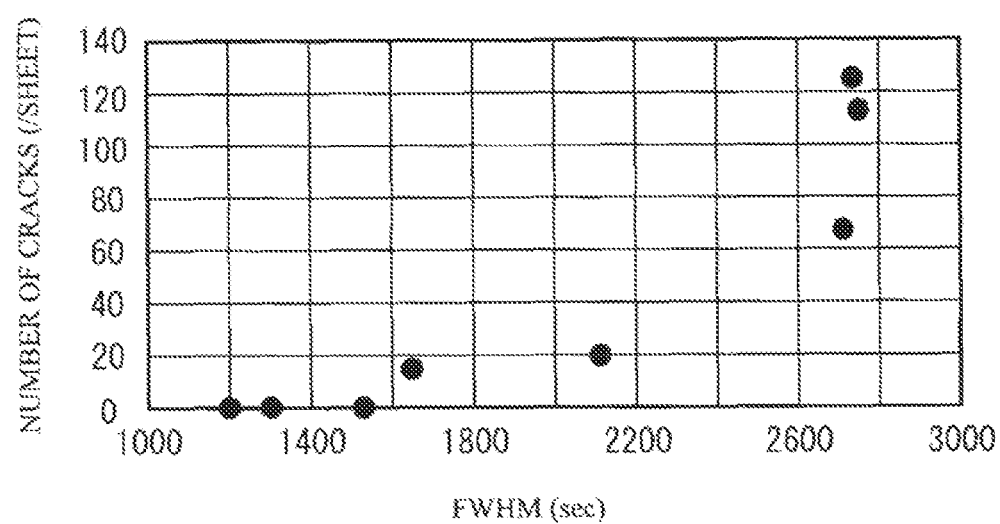
FIG. 2 is a graph of a relationship between FWHM (full width at Half Maximum) and the number of cracks.

Next, a description is given of a relationship between the crystal quality of the AlN layer 12 and cracks that occur in the GaN-based semiconductor layer 21. FIG. 2 is a graph of a relationship between FWHM (Full Width at Half Maximum) and the number of cracks. The FWHM is the full width at half maximum of a rocking curve of the (002) plane of the AlN layer 12 by x-ray diffraction. The horizontal axis of the graph indicates the FWHM of the AlN layer 12, and the vertical axis indicates the number of cracks detected in the GaN-based semiconductor layer 21. The x-ray diffraction used a sample of a semiconductor substrate in which the AlN layer 12 has been formed on the Si substrate 10 and the GaN-based semiconductor layer 21 has not yet been formed (a state illustrated in FIG. 3C, which will be described later). The number of cracks was counted by using a sample of a 4-inch wafer in the state illustrated in FIG. 1 and measuring the sample by a surface investigation device.

As illustrated in FIG. 2, many cracks were observed when the FWHM was large. In contrast, as the FWHM was smaller, a smaller number of cracks was observed. In other words, as the crystal quality of the AlN layer 12 was better, a smaller number of cracks occurred in the GaN-based semiconductor layer 21. Particularly, when the FWHM was not less than 1500 seconds, the number of crack was almost zero. Through the above experimental results, the inventors found out that there is a correlation between the crystal quality of the AlN layer 12 and cracks that occur in the GaN-based semiconductor layer 21 and that a smaller number of cracks occur as the crystal quality of the AlN layer 12 becomes better. Further, through the above experimental results, the inventors found out that the AlN layer 12 having an improve crystal quality can be grown by sequentially performing the step of supplying the Al source only and the step of supplying both the Al source and the N source. A first embodiment is an exemplary method for fabricating a semiconductor device having the above two steps in the growth of the AlN layer 12.

A description is now given of a method for fabricating a semiconductor device in accordance with the first embodiment. FIGS. 3A through 3D are cross-sectional views that illustrate the fabrication method of the first embodiment.

The substrate 10 is formed of silicon having an orientation in the (111) plane. The AlN layer 12 and the GaN-based semiconductor layer 21 may be grown by MOCVD (Metal Oxide Chemical Vapor Deposition). First, the step of growing the AlN layer 12 is carried out. The condition for this step is as follows.

Al source: TMA (trimethylaluminium)
N source: NH$_3$ (ammonia)
Temperature: 1050° C.
Pressure: 100 Torr (13.3 MPa)

Figure 3A:
FIGS. 3A through 3D are cross-sectional views that illustrate a method for fabricating a semiconductor device in accordance with a first embodiment.
Figure 3B:
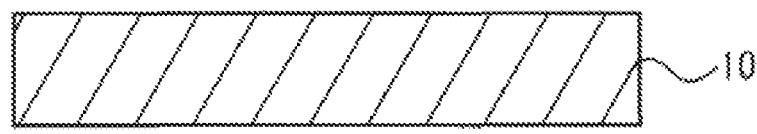

Referring to FIG. 3A, the substrate 10 is placed in the MOCVD apparatus, and the step of supplying only TMA, which is an AlN source, is carried out. During this step, NH3, which is a N source, is not supplied. As will be described later, a change of the quantity of supply of TMA in the present step (the total quantity of pre-flow of TMA) changes the crystal quality of the AlN layer 12 and the characteristics of the semiconductor device. Referring to FIG. 3B, the step of supplying TMA and NH3 is carried out after the step of supplying TMA only.

Figure 3C:
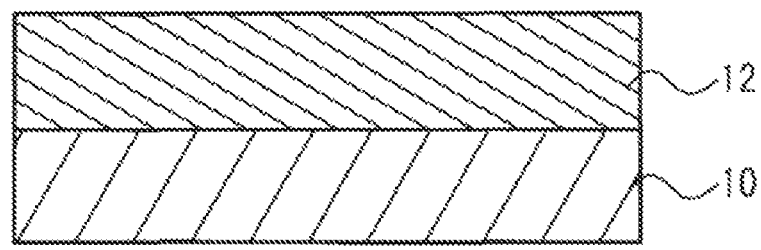

As illustrated in FIG. 3C, the AlN layer 12 is formed on the substrate 10 by the steps of FIGS. 3A and 3B. The thickness of the AlN layer 12 may be 300 nm, for example.

Figure 3D:
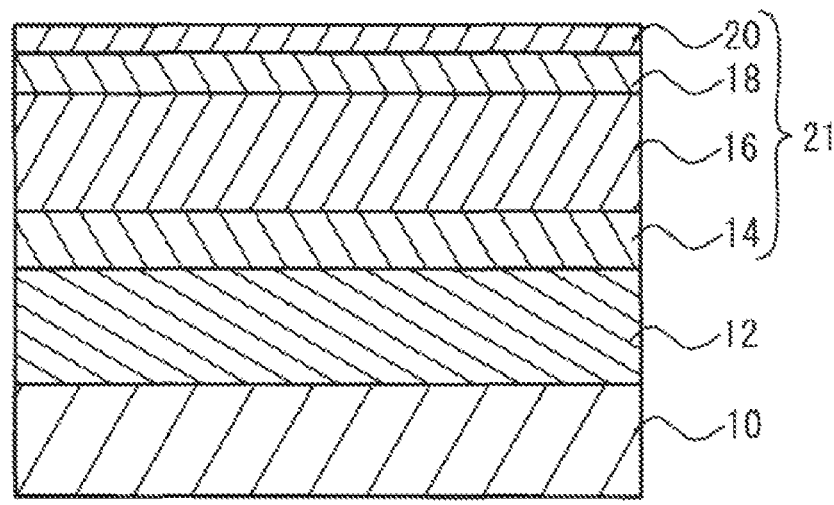

As illustrated in FIG. 3D, the AlGaN layer 14 is grown on the AlN layer 12 by MOCVD, and the undoped GaN layer 16 is grown on the AlGaN layer 14 by MOCVD. Further, the n-type AlGaN layer 18 is grown on the undoped GaN layer 16 by MOCVD, and the n-type GaN layer 20 is grown on the n-type AlGaN layer 18 by MOCVD. Thus, the GaN-based semiconductor layer 21 is formed on the AlN layer 12. The GaN layer is oriented in the (0001) plane. The semiconductor device is fabricated through the above steps.

Figure 4A:
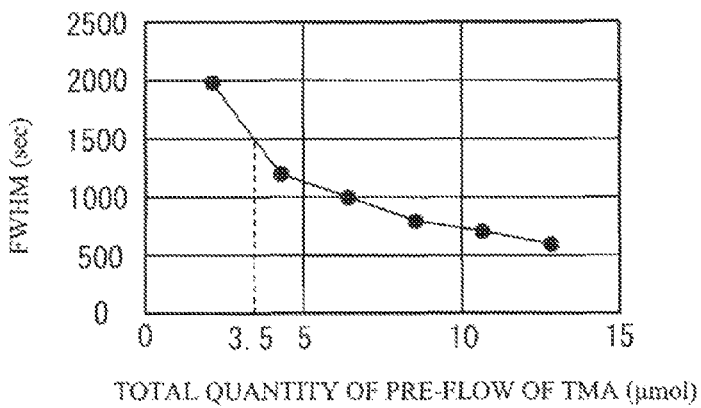
FIG. 4A is a graph of a relationship between the quantity of pre-flow of TMA and FWHM.
Figure 4B:
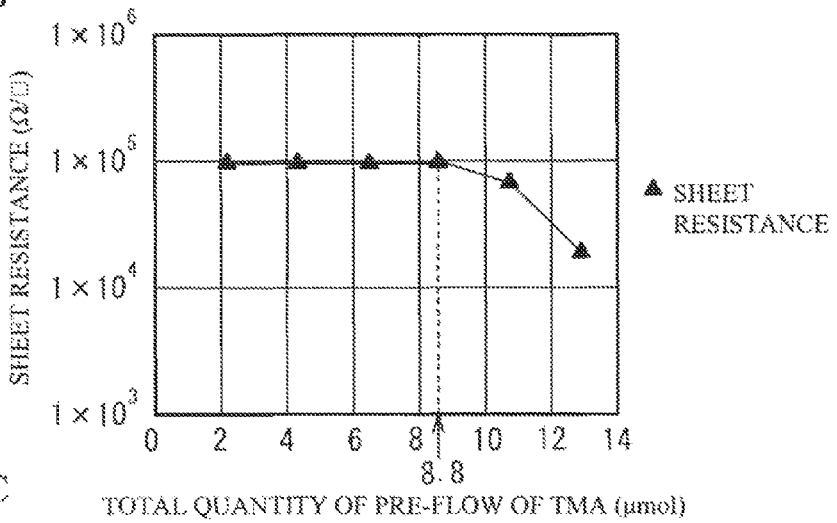
FIG. 4B is a graph of a relationship between the quantity of pre-flow of TMA and a sheet resistance.
Figure 4C:
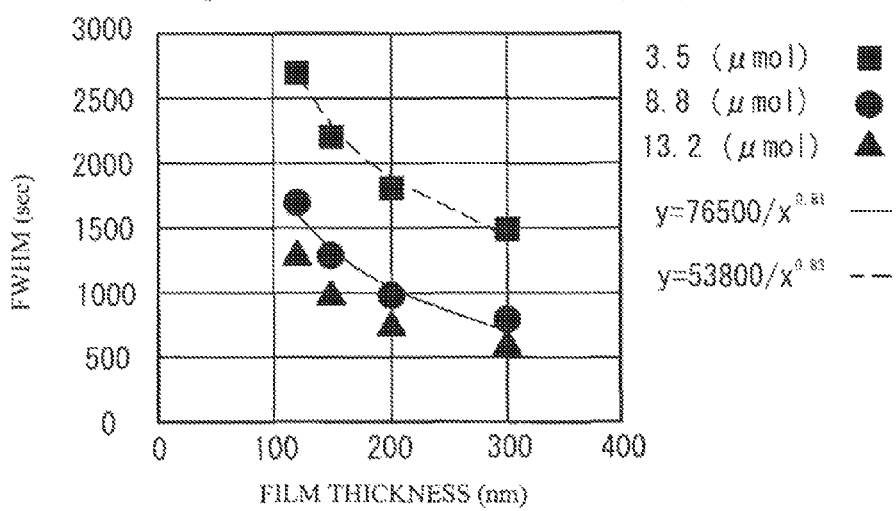
FIG. 4C is a graph of a relationship between the thickness of an AlN layer and FWHM.

A description is now given of experiments conducted by the inventors in which the crystal quality of the AlN layer 12 and the characteristics of the semiconductor device were validated while the quantity of pre-flow of TMA was changed. FIG. 4A is a graph of a relationship between the quantity of pre-flow of TMA and the FWHM, FIG. 4B is a graph of a relationship between the quantity of pre-flow of TMA and the sheet resistance, and FIG. 4C is a graph of a relationship between the thickness of the AlN layer and the FWHM. The measurement of the x-ray diffraction and the sheet resistance were carried out for a sample that was the semiconductor device in FIG. 3C. In the experiments, the thickness of the AlN layer 12 was 300 nm.

The relationship illustrated in FIG. 4A is now described. The horizontal axis of the graph indicates the total quantity of pre-flow of TMA, and the vertical axis thereof indicates the FWHM of the AlN layer 12. As illustrated in FIG. 4A, as the total quantity of pre-flow of TMA increases, the FWHM decreases. That is, as the total quantity of pre-flow of TMA increases, the crystal quality of the AlN layer 12 is improved. Particularly, as indicated by the dotted line, the FWHM becomes less than 1500 seconds when the total quality of the pre-flow of TMA becomes greater than 3.5 µmol. As has been described with reference to FIG. 2, in the case where the FWHM is not greater than 1500 seconds, the number of cracks in the GaN-based semiconductor layer 21 is almost zero.

The graph of FIG. 4B is described below. The horizontal axis of the graph indicates the total quality of the pre-flow of TMA, and the vertical axis thereof indicates the sheet resistance of the semiconductor substrate in the state illustrated in FIG. 3C. Triangles in FIG. 4B indicate the sheet resistance due to the resistance of the Si substrate.

As illustrated in FIG. 4B, the sheet resistance is 100 k$\Omega$/☐ when the total quality of the pre-flow of TMA is in the range of about 2 µmol to about 8 µmol. The sheet resistance of the Si substrate 10 only is 100 k$\Omega$/☐. It was observed that the pre-flow of TMA hardly affected the sheet resistance of the Si substrate 10 when the total quality of the pre-flow of TMA was in the range of about 2 µmol to about 8 µmol. In contrast, as indicated by a dotted line in FIG. 4B, when the total quantity of pre-flow of TMA is greater than 8.8 µmol, the sheet resistance becomes smaller than 100 k$\Omega$/☐. The above facts may result from a phenomenon in which Al supplied by the pre-flow of TMA diffuses into the Si substrate 10 and a resultant low-resistance layer is formed in the Si substrate 10. The low-resistance layer in the Si substrate 10 may lead to leakage after the semiconductor device is completed. For example, the FET, which is an exemplary semiconductor device fabricated by the present process may have a degraded RF characteristic. Even if the growth temperature is changed to 1040° C., the sheet resistance decreases when the quantity of pre-flow of TMA becomes greater than 8.8 µmol.

It can be seen from the experimental results illustrated in FIG. 4A that the occurrence of cracks in the GaN-based semiconductor layer 21 can be suppressed by setting the total quantity of preflow of TMA greater than 3.5 µmol in the case where the thickness of the AlN layer 12 is 300 nm. In contrast, it can be seen from the experimental results illustrated in FIG. 4B that the sheet resistance of the Si substrate 10 decreases in the case where the total quantity of pre-flow of TMA is not less than 8.8 µmol. That is, when the AlN layer 12 is 300 nm thick, the AlN layer 12 having an improved crystal quality can be grown and the occurrence of cracks can be suppressed by setting the total quantity of pre-flow of TMA greater than 3.5 µmol and less than 8.8 µmol. Further, it is possible to suppress the influence of the pre-flow of TMA to the sheet resistance.

A description is now given of an experiment in which the thickness of the AlN layer 12 was changed. The horizontal axis of the graph of FIG. 4C indicates the thickness of the AlN layer 12, and the vertical axis thereof indicates the FWHM. Squares are cases where the total quantity of pre-flow of TMA is 3.5 µmol, circles are cases where the total quantity of pre-flow of TMA is 8.8 µmol, and triangles are cases where the total quantity of pre-flow of TMA is 13.2 µmol. A curve of a solid like is a fitting curve of data for 8.8 µmol, and a curve of a broken line is a fitting curve of data for 3.5 µmol.

As illustrated in FIG. 4C, as the thickness of the AlN layer 12 increases, the FWHM decreases. As the total quantity of pre-flow of TMA increases, the FWHM decreases. As has been described with reference to FIG. 4B, the influence of the sheet resistance may be suppressed by setting the quantity of pre-flow of TMA less than 8.8 µmol. As indicated by the solid line in FIG. 4C, data for 8.8 µmol used to vary the thickness of the AlN layer 12 may be fit to a curve described below:

$$y=76500/x^{0.81}$$

where x is the thickness (nm) of the AlN layer 12, and y is the FWHM (sec).

As has been described with reference to FIG. 4A, the occurrence of cracks can be suppressed by setting the quantity of pre-flow of TMA greater than 3.5 μmol. As indicated by the broken line in FIG. 4C, data for 3.5 μmol used to vary the thickness of the AlN layer 12 may be fit to a curve described below:

$$y=53800/x^{0.83}$$

According to the first embodiment, the AlN layer 12 is grown by the step of supplying TMA (Al source) only illustrated in FIG. 3A and the subsequent step of supplying TMA and NH$_3$ (N source) illustrated in FIG. 3B. The AlN layer 12 is grown so as to meet the following conditions about the thickness (x) and FWHM (y):

$$76500/x^{0.81}<y<53800/x^{0.83}$$

It is thus possible to grow the AlN layer 12 having a good crystal quality and suppress the occurrence of cracks. It is also possible to suppress the influence to the sheet resistance due to the pre-flow of TMA. That is, the AlN layer 12 having a good crystal quality can be realized even by using the silicon substrate, which is less expensive, a larger wafer scale and fewer crystal defects than the SiC substrate.

The Al source is not limited to TMA but may be another source such as triethylaluminium (TEA). The N source is not limited to NH$_3$ but may be at least one of dimethylhydrazine and nitrogen radical. In order to suppress the occurrence of leakage current, the sheet resistance is preferably not less than 100 kΩ/□, and is more preferably not less than 150 kΩ/□, and much more preferably not less than 200 kΩ/□.

In case where the total thickness of the AlN layer 12 is too small, the AlN layer 12 may not function as the buffer layer sufficiently. In this case, impurities such as Ga that diffuse into the Si substrate 10 serve as dopants, which may cause a leakage current. In contrast, in case where the total thickness is too large, the semiconductor device may have a warp due to stress. Thus, it is preferable that the thickness of the AlN layer 12 is not less than 200 nm and is not greater than 400 nm. The thickness of the AlN layer 12 may be not less than 200 nm and may be not greater than 400 nm. The thickness of the AlN 12 may be not less than 250 nm and is not greater than 350 nm.

In order to suppress the occurrence of cracks in the GaN-based semiconductor layer 21, as illustrated in FIG. 2, the FWHM is preferably not greater than 2500 seconds, and is more preferably not greater than 2000 seconds. In order to reduce the number of cracks to almost zero, the FWHM is preferably set equal to or less than 1500 seconds.

The GaN-based semiconductor is a semiconductor including GaN, and may be, besides GaN and AlGaN, InGaN that is a mixed crystal of GaN and InN (indium nitride) or AlInGaN that is a mixed crystal of GaN, AlN and InN.

(Second Embodiment)

Figure 5:
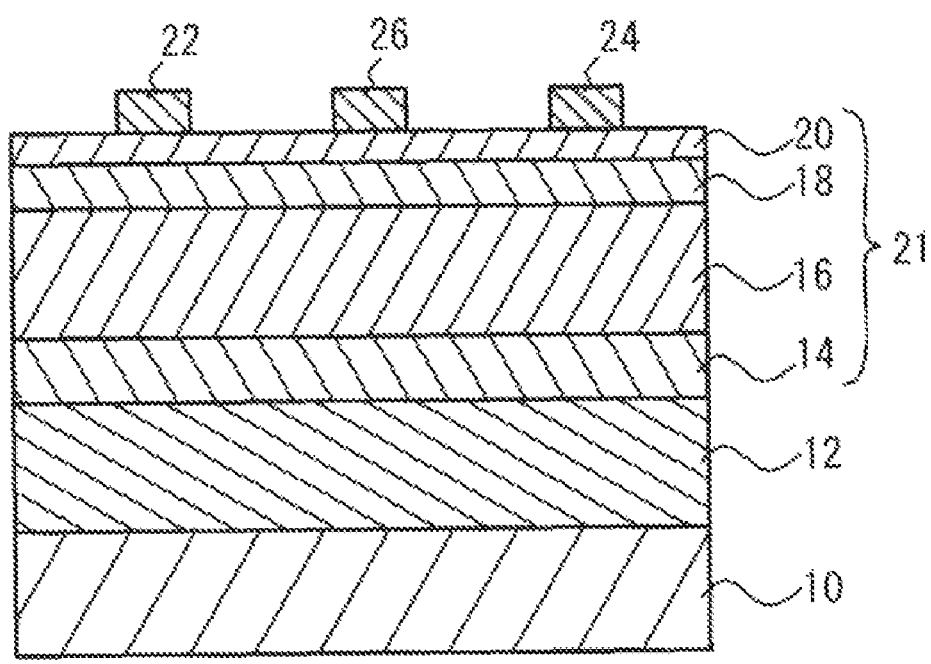
FIG. 5 is a cross-sectional view that illustrates a method for fabricating a semiconductor device in accordance with a second embodiment.

A second embodiment is an exemplary method for fabricating an FET. FIG. 5 is a cross-sectional view of a semiconductor device fabricated by a method in accordance with the second embodiment. The present fabrication method includes the steps illustrated in FIGS. 3A through 3D, and a description thereof is omitted here.

Referring to FIG. 5, a source electrode 22, a drain electrode 24 and a gate electrode 26 are formed on the n-type GaN layer 20. Each of the source electrode 22 and the drain electrode 24 is an ohmic electrode formed by stacking Ti on the n-GaN layer 20 and stacking Au on Ti. The gate electrode 26 may be formed by stacking Ni on the n-GaN layer 20 and stacking Au on Ni. The AlGaN layer 14 functions as a buffer layer. The undoped GaN layer 16 functions as a channel layer. The n-type AlGaN layer 18 functions as an electron supply layer. The n-type GaN layer 20 functions as a cap layer.

According to the second embodiment, like the first embodiment, the AlN layer 12 is grown so as to meet the following conditions about the thickness (x) and FWHM (y):

$$76500/x^{0.81}<y<53800/x^{0.83}$$

It is thus possible to grow the AlN layer 12 having a good crystal quality and suppress the occurrence of cracks. It is also possible to suppress the influence to the sheet resistance due to the pre-flow of TMA. Particularly, in FET, there is a possibility that the RF characteristics may be degraded due to the occurrence of cracks or the growth of a low-resistance layer. According to the second embodiment, it is possible to realize the method for fabricating FETs capable of suppressing degradation of the RF characteristics.

The present invention is not limited to the specifically described embodiments but includes other embodiments and variations within the scope of the claimed invention.

What is claimed is:

1. A method for fabricating a semiconductor device comprising:
   forming an AlN layer on a substrate made of silicon by supplying an Al source without supplying a N source and then supplying both the Al source and the N source; and
   forming a GaN-based semiconductor layer on the AlN layer after the forming of the AlN layer,
   the forming of the AlN layer growing the AlN layer so as to satisfy the following:

$$76500/x^{0.81}<y<53800/x^{0.83}$$

where x is a thickness of the AlN layer and y is an FWHM of a rocking curve of a (002) plane of the AlN layer.

2. The method according to claim 1, wherein the forming of the AlN layer comprises growing the AlN layer by a MOCVD method in which trimethylaluminium or triethylamine is used as the Al source.

3. The method according to claim 1, wherein the forming of the AlN layer comprises growing the AlN layer by using at least one of ammonia, dimethylhydrazine and nitrogen radical.

4. The method according to claim 1, wherein the substrate has a sheet resistance of 100 kΩ/□ or greater.

5. The method according to claim 1, wherein the forming of the AlN layer comprises growing the AlN layer so as to have a thickness that is not less than 200 nm and is not greater than 400 nm.

6. The method according to claim 1, wherein the semiconductor device is an FET.

* * * * *